(12) United States Patent
Subramonium et al.

(10) Patent No.: US 8,110,493 B1
(45) Date of Patent: Feb. 7, 2012

(54) PULSED PECVD METHOD FOR MODULATING HYDROGEN CONTENT IN HARD MASK

(75) Inventors: Pramod Subramonium, Salem, OR (US); Zhiyuan Fang, West Linn, OR (US); Jon Henri, West Linn, OR (US)

(73) Assignee: Novellus Systems, Inc., San Jose, CA (US)

( * ) Notice: Subject to any disclaimer, the term of this patent is extended or adjusted under 35 U.S.C. 154(b) by 719 days.

(21) Appl. No.: 12/048,967

(22) Filed: Mar. 14, 2008

Related U.S. Application Data

(63) Continuation-in-part of application No. 11/318,269, filed on Dec. 23, 2005, now Pat. No. 7,381,644.

(51) Int. Cl.
*H01L 21/4763* (2006.01)

(52) U.S. Cl. ......................... 438/618; 438/637; 438/780

(58) Field of Classification Search .......... 438/618–628, 438/637–641
See application file for complete search history.

(56) References Cited

U.S. PATENT DOCUMENTS

| 4,209,357 | A | 6/1980 | Gorin et al. |
| 4,274,841 | A | 6/1981 | Andersen et al. |
| 4,357,451 | A | 11/1982 | McDaniel |
| 4,668,261 | A | 5/1987 | Chatzipetros et al. |
| 4,863,493 | A | 9/1989 | Kotani et al. |
| 4,863,760 | A | 9/1989 | Schantz et al. |
| 4,882,008 | A | 11/1989 | Garza et al. |
| 4,885,262 | A | 12/1989 | Ting et al. |
| 5,231,057 | A | * 7/1993 | Doki et al. .................... 438/637 |
| 5,261,250 | A | 11/1993 | Missimer |
| 5,378,316 | A | 1/1995 | Franke et al. |
| 5,470,661 | A | 11/1995 | Bailey et al. |
| 5,504,042 | A | 4/1996 | Cho et al. |
| 5,562,952 | A | 10/1996 | Naskahigashi et al. |
| 5,670,066 | A | 9/1997 | Barnes et al. |
| 5,686,054 | A | 11/1997 | Barthel et al. |
| 5,700,844 | A | 12/1997 | Hedrick et al. |
| 5,789,027 | A | 8/1998 | Watkins et al. |
| 5,849,628 | A | 12/1998 | Sandhu et al. |
| 5,849,640 | A | 12/1998 | Hsia et al. |
| 5,851,715 | A | 12/1998 | Barthel et al. |
| 5,858,457 | A | 1/1999 | Brinker et al. |
| 5,920,790 | A | 7/1999 | Wetzel et al. |
| 6,030,591 | A | 2/2000 | Tom et al. |
| 6,035,803 | A | 3/2000 | Robles et al. |

(Continued)

FOREIGN PATENT DOCUMENTS

KR 10-0986503 10/2010

(Continued)

OTHER PUBLICATIONS

U.S. Appl. No. 11/318,269, Office Action mailed Aug. 27, 2007.

(Continued)

*Primary Examiner* — H. Jey Tsai
(74) *Attorney, Agent, or Firm* — Weaver Austin Villeneuve & Sampson LLP

(57) ABSTRACT

A method for forming a PECVD deposited amorphous carbon or ashable hard mask (AHM) in a trench or a via with less than 30% H content at a process temperature below 500° C., e.g., about 400° C. produces low H content hard masks with high selectivity and little or no hard mask on the sidewalls. The deposition method utilizes a pulsed precursor delivery with a plasma etch while the precursor flow is off.

22 Claims, 9 Drawing Sheets

U.S. PATENT DOCUMENTS

| | | | |
|---|---|---|---|
| 6,041,734 A | 3/2000 | Raoux et al. | |
| 6,066,209 A | 5/2000 | Sajoto et al. | |
| 6,140,252 A | 10/2000 | Cho et al. | |
| 6,150,719 A | 11/2000 | Saia et al. | |
| 6,177,329 B1 | 1/2001 | Pang | |
| 6,241,793 B1 | 6/2001 | Lee et al. | |
| 6,258,735 B1 | 7/2001 | Xia et al. | |
| 6,268,276 B1 | 7/2001 | Chan et al. | |
| 6,270,846 B1 | 8/2001 | Brinker et al. | |
| 6,271,273 B1 | 8/2001 | You et al. | |
| 6,286,321 B1 | 9/2001 | Glater | |
| 6,312,793 B1 | 11/2001 | Grill et al. | |
| 6,319,299 B1 | 11/2001 | Shih et al. | |
| 6,329,017 B1 | 12/2001 | Liu et al. | |
| 6,329,062 B1 | 12/2001 | Gaynor | |
| 6,331,480 B1 | 12/2001 | Tsai et al. | |
| 6,340,628 B1 | 1/2002 | Van Cleemput et al. | |
| 6,365,266 B1 | 4/2002 | MacDougall et al. | |
| 6,367,413 B1 | 4/2002 | Sill et al. | |
| 6,383,466 B1 | 5/2002 | Domansky et al. | |
| 6,383,955 B1 | 5/2002 | Matsuki et al. | |
| 6,386,466 B1 | 5/2002 | Ozawa et al. | |
| 6,387,453 B1 | 5/2002 | Brinker et al. | |
| 6,391,932 B1 | 5/2002 | Gore et al. | |
| 6,392,017 B1 | 5/2002 | Chandrashekar | |
| 6,420,441 B1 | 7/2002 | Allen et al. | |
| 6,444,715 B1 | 9/2002 | Mukherjee et al. | |
| 6,465,051 B1 | 10/2002 | Sahin et al. | |
| 6,478,924 B1 | 11/2002 | Shamouilian et al. | |
| 6,479,374 B1 | 11/2002 | Ioka et al. | |
| 6,500,770 B1 | 12/2002 | Cheng et al. | |
| 6,541,397 B1 | 4/2003 | Bencher | |
| 6,548,113 B1 | 4/2003 | Birnbaum et al. | |
| 6,573,030 B1 * | 6/2003 | Fairbairn et al. | 430/323 |
| 6,576,345 B1 | 6/2003 | Cleemput et al. | |
| 6,596,467 B2 | 7/2003 | Gallagher et al. | |
| 6,596,654 B1 | 7/2003 | Bayman et al. | |
| 6,610,362 B1 | 8/2003 | Towle | |
| 6,617,553 B2 | 9/2003 | Ho et al. | |
| 6,632,478 B2 | 10/2003 | Gaillard et al. | |
| 6,667,147 B2 | 12/2003 | Gallagher et al. | |
| 6,677,251 B1 | 1/2004 | Lu et al. | |
| 6,756,085 B2 | 6/2004 | Waldfried et al. | |
| 6,777,349 B2 | 8/2004 | Fu et al. | |
| 6,797,643 B2 | 9/2004 | Rocha-Alvarez et al. | |
| 6,805,801 B1 | 10/2004 | Humayun et al. | |
| 6,812,043 B2 | 11/2004 | Bao et al. | |
| 6,815,373 B2 | 11/2004 | Singh et al. | |
| 6,831,284 B2 | 12/2004 | Demos et al. | |
| 6,848,458 B1 | 2/2005 | Shrinivasan et al. | |
| 6,914,014 B2 | 7/2005 | Li et al. | |
| 6,967,072 B2 | 11/2005 | Latchford et al. | |
| 7,223,526 B2 | 5/2007 | Fairbairn et al. | |
| 7,238,393 B2 | 7/2007 | Goundar et al. | |
| 7,314,506 B2 | 1/2008 | Vininski et al. | |
| 7,323,401 B2 | 1/2008 | Ramaswamy et al. | |
| 7,381,644 B1 | 6/2008 | Subramonium et al. | |
| 7,745,346 B2 | 6/2010 | Hausmann et al. | |
| 7,820,556 B2 | 10/2010 | Hsu et al. | |
| 7,955,990 B2 | 6/2011 | Henri et al. | |
| 7,981,777 B1 | 7/2011 | Subramonium et al. | |
| 7,981,810 B1 | 7/2011 | Subramonium et al. | |
| 2001/0021491 A1 | 9/2001 | Chen et al. | |
| 2002/0001973 A1 | 1/2002 | Wu et al. | |
| 2002/0034626 A1 | 3/2002 | Liu et al. | |
| 2002/0106500 A1 | 8/2002 | Albano et al. | |
| 2002/0123240 A1 | 9/2002 | Gallagher et al. | |
| 2002/0182848 A1 | 12/2002 | Joseph et al. | |
| 2002/0192980 A1 | 12/2002 | Hogle et al. | |
| 2003/0044532 A1 | 3/2003 | Lee et al. | |
| 2003/0064607 A1 | 4/2003 | Leu et al. | |
| 2003/0119307 A1 | 6/2003 | Bekiaris et al. | |
| 2003/0157248 A1 | 8/2003 | Watkins et al. | |
| 2004/0016972 A1 | 1/2004 | Singh et al. | |
| 2004/0018750 A1 | 1/2004 | Sophie et al. | |
| 2004/0023502 A1 | 2/2004 | Tzou et al. | |
| 2004/0069410 A1 | 4/2004 | Moghadam et al. | |
| 2004/0096672 A1 | 5/2004 | Lukas et al. | |
| 2004/0099952 A1 | 5/2004 | Goodner et al. | |
| 2004/0101633 A1 | 5/2004 | Zheng et al. | |
| 2004/0102031 A1 | 5/2004 | Kloster et al. | |
| 2004/0140506 A1 | 7/2004 | Singh et al. | |
| 2004/0161941 A1 | 8/2004 | Donohoe et al. | |
| 2004/0180551 A1 | 9/2004 | Biles et al. | |
| 2004/0185679 A1 | 9/2004 | Ott et al. | |
| 2004/0195659 A1 | 10/2004 | Grill et al. | |
| 2004/0224504 A1 * | 11/2004 | Gadgil | 438/680 |
| 2004/0266195 A1 | 12/2004 | Dokumaci et al. | |
| 2005/0022864 A1 | 2/2005 | Fujioka et al. | |
| 2005/0042889 A1 | 2/2005 | Lee et al. | |
| 2005/0098119 A1 | 5/2005 | Burger et al. | |
| 2005/0112506 A1 | 5/2005 | Czech et al. | |
| 2005/0130404 A1 * | 6/2005 | Moghadam et al. | 438/623 |
| 2006/0091559 A1 | 5/2006 | Nguyen et al. | |
| 2006/0154086 A1 | 7/2006 | Fuller et al. | |
| 2006/0197881 A1 | 9/2006 | Kang et al. | |
| 2006/0205223 A1 | 9/2006 | Smayling | |
| 2007/0032054 A1 * | 2/2007 | Ramaswamy et al. | 438/513 |
| 2007/0048674 A1 | 3/2007 | Wells | |
| 2007/0054500 A1 * | 3/2007 | Bencher | 438/780 |
| 2007/0059913 A1 | 3/2007 | King et al. | |
| 2007/0105303 A1 * | 5/2007 | Busch et al. | 438/253 |
| 2007/0125762 A1 | 6/2007 | Cui et al. | |
| 2007/0128538 A1 | 6/2007 | Fairbairn et al. | |
| 2007/0166546 A1 | 7/2007 | Ichikawa et al. | |
| 2007/0166979 A1 | 7/2007 | Wang et al. | |
| 2007/0202640 A1 * | 8/2007 | Al-Bayati et al. | 438/184 |
| 2007/0247073 A1 | 10/2007 | Paterson et al. | |
| 2008/0128907 A1 | 6/2008 | Yang et al. | |
| 2008/0242116 A1 | 10/2008 | Clark | |
| 2008/0242912 A1 | 10/2008 | Letessier et al. | |
| 2008/0254641 A1 | 10/2008 | Kobayashi et al. | |
| 2009/0182180 A1 | 7/2009 | Huang et al. | |
| 2009/0305516 A1 | 12/2009 | Hsu et al. | |
| 2010/0099271 A1 | 4/2010 | Hausmann et al. | |
| 2010/0151691 A1 | 6/2010 | Henri et al. | |
| 2010/0297853 A1 | 11/2010 | Hsu et al. | |

FOREIGN PATENT DOCUMENTS

| | | |
|---|---|---|
| WO | WO95/07543 | 3/1995 |
| WO | 2005/048367 | 5/2005 |

OTHER PUBLICATIONS

U.S. Appl. No. 12/253,807, Office Action mailed Sep. 30, 2009.
WO patent application No. PCT/US2009/061064, International Search Report and Written Opinion mailed May 12, 2010.
U.S. Appl. No. 11/612,382, Office Action mailed Jun. 1, 2007.
U.S. Appl. No. 11/612,382, Office Action mailed Feb. 24, 2009.
U.S. Appl. No. 11/612,382, Office Action mailed May 12, 2009.
U.S. Appl. No. 11/710,377, Office Action mailed Aug. 19, 2009.
U.S. Appl. No. 12/133,223, Office Action mailed Aug. 19, 2009.
U.S. Appl. No. 11/449,983, Office Action mailed Sep. 15, 2009.
U.S. Appl. No. 11/710,652, Office Action mailed Nov. 20, 2009.
U.S. Appl. No. 11/612,382, Office Action mailed Dec. 9, 2009.
U.S. Appl. No. 12/133,223, Office Action mailed Dec. 21, 2009.
U.S. Appl. No. 12/133,223, Notice of Allowance mailed Mar. 2, 2010.
U.S. Appl. No. 12/133,223, Allowed Claims.
U.S. Appl. No. 11/710,377, Office Action mailed Mar. 31, 2010.
U.S. Appl. No. 11/612,382, Office Action mailed Mar. 26, 2010.
U.S. Appl. No. 12/766,721, "Methods for Forming Conductive Carbon Films by PECVD", Fox et al., filed Apr. 23, 2010.
U.S. Appl. No. 12/786,842, "Method for purifying acetylene gas for use in semiconductor processes", Hsu et al., filed May 25, 2010.
U.S. Appl. No. 11/449,983, Office Action mailed Jun. 21, 2010.
U.S. Office Action mailed Jan. 5, 2009, from U.S. Appl. No. 11/449,983.
U.S. Office Action mailed Jan. 5, 2009, from U.S. Appl. No. 11/710,377.
Henri, et al., Method for Improved Thickness Repeatability of PECVD Deposited Carbon Films, Novellus Systems, Inc., U.S. Appl. No. 12/334,220, filed Dec. 12, 2008.
Cho et al., "Plasma Treatments of Molecularly Templated Nanoporous Silica Films," Electrochemical and Solid-State Letters, 4 (4) G35-G38 (2001).

Yung et al., "Spin-on Mesoporous Silica Films with Ultralow Dielectric Constants, Ordered Pore Structures, and Hydrophobic Surfaces," Adv. Mater. 2001, 13, No. 14, 1099-1102.

Schulberg et al., "System for Deposition of Mesoporous Materials," U.S. Appl. No. 10/295,965, filed Nov. 15, 2002, 64 Pages.

Watkins et al., "Mesoporous Materials and Methods," U.S. Appl. No. 10/301,013, filed Nov. 21, 2002, 34 Pages.

Justin F. Gaynor, "In-Situ Treatment of Low-K Films With a Silylating Agent After Exposure to Oxidizing Environments," U.S. Appl. No. 10/056,926, filed Jan. 24, 2002, 34 Pages.

Humayun et al., "Method for Forming Porous Films by Porogen Removel Combined Wtih In Situ Surface Modification", Novellus Corporation, U.S. Appl. No. 10/404,693, filed Mar. 31, 2003, pp. 1-32.

Tipton et al., "Method of Porogen Removal From Porous Low-K Films Using UV Radiation", Novellus Systems, Inc., U.S. Appl. No. 10/672,311, filed Sep. 26, 2003, pp. 1-27.

Jan, C.H., et al, 90NM Generation, 300mm Wafer Low k ILD/Cu Interconnect Technology, 2003 IEEE Interconnect Technology Conference.

Wu et al., U.S. Appl. No. 10/789,103, entitled: Methods for Producing Low-K CDO Films With Low Residual Stress.

Wu et al., U.S. Appl. No. 10/820,525, entitled: Methods for Producing Low-K CDO Films With Low Residual Stress.

Wu et al., U.S. Appl. No. 10/800,409, entitled: Methods for Producing Low-K CDO Films.

U.S. Appl. No. 10/016,017, filed Dec. 12, 2001.

U.S. Appl. No. 10/125,614, filed Apr. 18, 2002.

Tipton et al., "Method for Removal of Porogens From Porous Low-K Films Using Supercritical Fluids", Novellus Systems, Inc., U.S. Appl. No. 10/672,305, filed Sep. 26, 2003, pp. 1-32.

U.S. Appl. No. 10/202,987, filed Jul. 23, 2002.

Gangpadhyay et al., "The First International Surface Cleaning Workshop," Northeastern University, Nov. 11-14, 2002.

Cho et al., "Method and Apparatus for UV Exposure of Low Dielectric Constant Materials for Porogen Removal and Improved Mechanical Properties", Novellus Systems, Inc., U.S. Appl. No. 10/800,377, filed Mar. 11, 2004, pp. 1-31.

Wu et al., "Method and Apparatus of UV Exposure of Low Dielectric Constant Materials for Porogen Removal and Improved Mechanical Properties", Novellus Systems, Inc., U.S. Appl. No. 10/807,680, filed Mar. 23, 2004, pp. 1-34.

Humayun et al., "Method for Forming Porous Films by Porogen Removal Combined With In Situ Modification", U.S. Appl. No. 10/404,693, filed Mar. 31, 2003, Office Action dated Mar. 15, 2005.

Tipton et al., "Method of Porogen Removal From Porous Low-K Films Using UV Radiation", U.S. Appl. No. 10/672,311, filed Sep. 26, 2003, Office Action dated Sep. 7, 2004.

Tipton et al., "Method of Porogen Removal From Porous Low-K Films Using UV Radiation", U.S. Appl. No. 10/672,311, filed Sep. 26, 2003, Office Action dated Dec. 28, 2004.

Tipton et al., "Method for Removal of Porogens From Porous Low-K Films Using Supercritical Fluids", U.S. Appl. No. 10/672,305, Office Action dated Mar. 22, 2005.

Bandyopadhyay et al., "Method to Improve Mechanical Strength of Low-K Dielectric Film Using Modulated UV Exposure", U.S. Appl. No. 10/825,888, filed Apr. 16, 2004.

R.D. Miller et al., "Phase-Separated Inorganic-Organic Hybrids for Microelectronic Applications," MRS Bulletin, Oct. 1997, pp. 44-48.

Jin et al., "Nanoporous Silica as an Ultralow-$k$ Dielectric," MRS Bulletin, Oct. 1997, pp. 39-42.

Asoh et al., "Fabrication of Ideally Ordered Anodic Porous Alumina with 63 nm Hole Periodocity Using Sulfuric Acid," J. Vac. Sci. Technol. B 19(2), Mar./Apr. 2001, pp. 569-572.

Asoh et al., "Conditions for Fabrication of Ideally Ordered Anodic Porous Alumina Using Pretextured AI," Journal of the Electrochemica Society, 148 (4) B152-B156 (2001) pp. B152-B156.

Holland et al., "Nonlithographic Technique for the Production of Large Area High Density Gridded Field Sources," J. Vac. Sci. Technol. B 17(2), Mar./Apr. 1999, pp. 580-582.

Masuda et al. "Highly Ordered Nanochannel-Array Architecture in Anodic Alumina," App. Phys. Lett. 71(19), Nov. 1997, pp. 2770-2772.

Clube et al., White Paper from Holotronic Technologies SA; downloaded from www.hdotronic.com/whitepaper/fine-patt.pdf on Mar. 12, 2002.

Meli et al., "Self-Assembled Masks for the Transfer of Nanometer-Scale Patterns into Surfaces: Characterization by AFM and LFM", Nano Letters, vol. 2, No. 2, 2002, 131-135.

"Shipley Claims Porous Low K Dielectric Breakthrough," Press Release Mar. 17, 2003.

Jeffrey M. Calvert and Michael K. Gallagher, Semiconductor International, 26 (12), 56 (2003).

Van Bavel et al., Future Fab International, 16, (2004).

Caluwaerts et al, "Post Patterning Meso Porosity Creation: A Potential Solution for Pore Sealing," IITC 2003.

Peter Singer, "New Materials and Designs to Improve Transistor Performance", Apr. 1, 2004, Semiconductor International.

Ghani et al, "A 90nm High Volume Manufacturing Logic Technology Featuring Novel 45nm Gate Length Strained Silicon CMOS Transistors", IEEE, © 2003.

Bhadri N. Varadarajan, "Tensile Silicon Nitride—P1264 NESL", C & F Study, Aug. 21, 2003.

Varadarajan, et al., "Strained Transistor Architecture and Method", Novellus Systems, Inc., U.S. Appl. No. 10/923,259, filed Aug. 20, 2004, pp. 1-24.

Niu et al., "Methods for Improving the Cracking Resistance of Low-K Dielectric Materials", U.S. Appl. No. 10/860,340, filed Jun. 2, 2004.

Niu et al., "Methods for Improving the Cracking Resistance of Low-K Dielectric Materials", U.S. Appl. No. 10/860,340, Office Action dated Mar. 2, 2005.

Niu et al., "Methods for Improving the Cracking Resistance of Low-K Dielectric Materials", U.S. Appl. No. 10/860,340, Final Office Action dated Jun. 13, 2005.

Wang et al., "Plasma Detemplating and Silanol Capping of Porous Dielectric Films", U.S. Appl. No. 10/785,235, filed Feb. 23, 2004.

Varadarajan et al., "Tensile Dielectric Films Using UV Curing", U.S. Appl. No. 10/972,084, filed Oct. 22, 2004.

Fox et al., "Method for Improving Mechanical Properties of Low Dielectric Constant Materials", U.S. Appl. No. 10/849,568, filed May 18, 2004.

Fox et al., "Methods for Producing Low-Stress Carbon-Doped Oxide Films With Improved Integration Properties", U.S. Appl. No. 10/987,208, filed Nov. 12, 2004.

Van Den Hoek et al., "VLSI Fabrication Processes for Introducing Pores Into Dielectric Materials," U.S. Appl. No. 11/050,621, filed Jan. 31, 2005.

Draeger et al., "Creation of Porosity in Low-K Films by Photo-Disassociation of Imbedded Nanoparticles," U.S. Appl. No. 11/146,456, filed Jun. 6, 2005.

Wu et al., "Methods for Producing Low Stress Porous Low-K Dielectric Materials Using Precursors With Organic Functional Groups", U.S. Appl. No. 10/927,777, filed Aug. 27, 2004.

Wu et al., "Methods for Producing Low Stress Porous Low-K Dielectric Materials Using Precursors With Organic Functional Groups", U.S. Appl. No. 10/927,777, filed Aug. 27, 2004.

Wu et al., "Methods for Improving Integration Performance of Low Stress CDO Films", U.S. Appl. No. 10/941,502, filed Sep. 14, 2004.

Cho et al., "Methods of Improving Porogen Removal and Film Mechanical Strength in Producing Ultra Low-K Carbon Doped Oxide Films Using Radical Photopolymerization", U.S. Appl. No. 10/982,654, filed Nov. 5, 2004.

U.S. Office Action mailed Jul. 13, 2005, from U.S. Appl. No. 10/672,311.

U.S. Office Action mailed Jul. 27, 2005, from U.S. Appl. No. 10/785,235.

U.S. Office Action mailed Aug. 24, 2005, from U.S. Appl. No. 10/404,693.

U.S. Office Action mailed Sep. 1, 2005, from U.S. Appl. No. 10/672,305.

Cho et al., "Mehtod for Porogen Removal and Mechanical Strength Enhancement of Low-K Carbon Doped Silicon Oxide Using Low Thermal Budget Microwave Curing", U.S. Appl. No. 11/280,113, filed Nov. 15, 2005.

U.S. Office Action mailed Dec. 14, 2006, from U.S. Appl. No. 11/318,269.

Ikeda et al., "Top-PECVD": A New Conformal Plasma Enhanced CVD Technology using TEOS, Ozone and Pulse-modulated RF Plasma, 1992 IEEE, pp. 11.2.1-11.2.4.

Subramonium et al., "Methods of Depositing Highly Selective Transparent Ashable Hardmask Films", U.S. Appl. No. 11/449,983, filed Jun. 8, 2006.

Subramonium et al., "Methods of Depositing Stable and Hermetic Ashable Hardmask Films," Novellus Systems, Inc., U.S. Appl. No. 11/710,377, filed Feb. 22, 2007, pp. 1-26.

Notice of Allowance and Fee Due mailed May 7, 2007 from U.S. Appl. No. 11/318,269.

Allowed Claims from U.S. Appl. No. 11/318,269.

Fang et al., "Methods of Improving Ashable Hardmask Adhesion to Metal layers," Novellus Systems, Inc., U.S. Appl. No. 11/612,382, filed Dec. 18, 2006.

U.S. Office Action mailed Oct. 9, 2007, from U.S. Appl. No. 11/612,382.

Grill, et al. "Diamondlike carbon films by rf plasma-assisted chemical vapor deposition from acetylene," IBM J. Res. Develop., vol. 34, No. 6, Nov. 1990, pp. 849-857.

Callegari et al., "Optical properties of hydrogenated amorphous-carbon film for attenuated phase-shift mask applications," J.Vac. Sci. Technol. B 11(6), Nov./Dec. 1993, pp. 2697-2699.

Grill, A., "Diamond-like carbon: state of the art," Diamond and Related Mateials 8 (1999) 428-434.

Grill, A., "Plasma-deposited diamondlike carbon and related materials," IBM Journal of Research and Development, vol. 43, ½, 1999, http://research.ibm.com/journal/rd/431/grill.html. 14 pages.

Kragler et al., "Scanning tunneling microscopy based lithography employing amorphous hydrogenated carbon as a high resolution resist mask," Appl. Phys. Lett. 67 (8), Aug. 21, 1995, pp. 1163-1165.

U.S. Office Action mailed Dec. 27, 2007, from U.S. Appl. No. 11/449,983.

Subramonium et al., "Methods and Apparatus for Plasma-Based Deposition," Novellus Systems, Inc., U.S. Appl. No. 11/849,208, filed Aug. 31, 2007.

Ikeda et al., "TOP-PECVD®: A new conformal plasma enhanced CVD technology using TEOS, ozone and pulse-modulated RF plasma", IEEE (1992), pp. 289-292.

U.S. Office Action mailed Jul. 9, 2008, from U.S. Appl. No. 11/449,983.

U.S. Final Office Action mailed May 13, 2008, from U.S. Appl. No. 11/612,382.

U.S. Office Action mailed Aug. 19, 2008, from U.S. Appl. No. 11/612,382.

Subramonium et al., "Methods of Depositing Smooth and Conformal Ashable Hard Mask Films," Novellus Systems, Inc., U.S. Appl. No. 12/163,670, filed Jun. 27, 2008.

Hsu et al., "Method for Purifying Acetylene Gas for Use in Semiconductor Processes," Novellus Systems, Inc., U.S. Appl. No. 12/133,223, filed Jun. 4, 2008.

U.S. Appl. No. 12/253,807, Notice of Allowance mailed Feb. 24, 2010.

Kr patent application No. 2009-0048358, Office Action mailed Jun. 1, 2010.

U.S. Appl. No. 11/849,208, Office Action mailed Sep. 3, 2010.

U.S. Appl. No. 11/449,983, Office Action mailed Dec. 30, 2010.

U.S. Appl. No. 12/334,220, Notice of Allowance mailed Nov. 2, 2010.

U.S. Appl. No. 12/334,220, Allowed Claims.

U.S. Appl. No. 11/449,983, Notice of Allowance mailed Mar. 16, 2011.

U.S. Appl. No. 11/710,377, Notice of Allowance mailed Mar. 22, 2011.

U.S. Appl. No. 11/849,208, Office Action mailed Apr. 12, 2011.

U.S. Appl. No. 12/334,220, Notice of Allowance mailed Feb. 8, 2011.

\* cited by examiner

| Number of Pulses | Pulse Frequency (Hz) | Duty cycle (%) | H content (%) | Film Thickness (A) |
|---|---|---|---|---|
| 54 | 0.15 | 25 | 15 | 2000 |
| 40 | 0.15 | 25 | 15 | 1500 |
| 27 | 0.15 | 25 | 15 | 1000 |
| 18 | 0.05 | 25 | 22 | 2000 |
| 30 | 0.09 | 25 | 18 | 2000 |

*FIG. 8*

PULSED PECVD METHOD FOR MODULATING HYDROGEN CONTENT IN HARD MASK

CROSS-REFERENCE TO RELATED APPLICATIONS

This application is a continuation-in-part of U.S. patent application Ser. No. 11/318,269, filed Dec. 23, 2005, now U.S. Pat. No. 7,381,644 which is incorporated herein in its entirety by reference for all purposes.

FIELD OF THE INVENTION

This invention relates to a novel method of producing ashable hard masks in semiconductor processing.

BACKGROUND OF THE INVENTION

Amorphous carbon films are used in patterning and as etch stop layers in semiconductor processing. As an etch stop layer, they are also known as ashable hard masks (AHMs). Etch selectivity of AHM is influenced primarily by the incorporated concentration of hydrogen. Reducing the amount of hydrogen incorporated in the film drives down the etch rate of the hard mask, thus increasing the selectivity.

To date, known methods of producing AHM with low hydrogen (H) content (e.g., below 20%) rely on a relatively high temperature (greater than 500° C.) PECVD deposition process. Many PECVD reactors are not designed to withstand such high processing temperatures, however. At process temperatures of about 400° C. and below, films typically have a high hydrogen content (about 40%) and corresponding relatively low etch selectivity. Accordingly, it would be desirable to be able to produce a hard mask film with a low hydrogen content (e.g., less than 30%, or 20%) and high etch selectivity at a relatively low deposition temperature (below 500° C., e.g., no more than 400° C.).

SUMMARY OF THE INVENTION

The present invention addresses this need by providing a method for forming a PECVD deposited amorphous carbon layer or ashable hard mask (AHM) with less than 30 atomic % H content (e.g., less than 20% H content) at a process temperature below 500° C., e.g., about 400° C. Low H content hard masks produced according to the invention have the property of high selectivity of the hard mask film to the underlying layers and substantially no deposition on sidewalls of a trench or a via. The low temperature, low H films, and AHM-free sidewalls are produced by use of a pulsed film hydrocarbon precursor with plasma etching during the precursor off portions of the pulse that reduce or eliminate deposits on the sidewalls.

The present invention involves forming an amorphous carbon layer or an ashable hard mask in a trench or a via with sidewalls substantially free of the material deposited in the trench. A semiconductor substrate is provided in a deposition chamber and amorphous carbon or AHM is deposited by a plasma enhanced chemical vapor deposition (PECVD) process. The process includes a pulsed delivery flow of a hard mask precursor to the deposition chamber with a duty cycle of less than 100% and a plasma containing etching species. The process temperature is below 500° C. The resulting AHM has a hydrogen content of less than 30%. The precursor flow is pulsed on and off. While the precursor is off, the plasma treats and etches deposited AHM. AHM film deposited on the sidewalls is removed, and AHM film deposited outside and in the bottom of the trench or via are treated by breaking —CHx bonds and forming —C=C bonds.

In certain embodiments, the etching species is hydrogen, provided by flowing $H_2$ or $NH_3$ into the plasma. In other embodiments, the etching species is oxygen, provided by flowing $O_2$, $CO_2$ into the plasma. Because the oxygen etching species are incompatible with the AHM precursor, the oxygen etching species is only used during the off portion of the precursor flow pulse. In other words, oxygen containing gas is added to the plasma to etch the film only when the precursor is not flowing.

In particular embodiments, the plasma power is also pulse modulated. The modulation may be power on/off or power low/high. The plasma power pulses may overlap or be exactly opposite of the precursor flow pulse (no overlap). The plasma power can be modulated higher when the precursor flow is off. In some cases, the plasma high pulse overlaps a portion but not all of the precursor flow pulse.

The resulting hard mask may have a hydrogen content of less thank 30%, preferably less than 25%, and even more preferably less than 20%. The pulsed precursor delivery flow may have a frequency of between about 0.09 Hz and 0.2 Hz, preferably about 0.1 Hz. A duty cycle of the pulse precursor delivery flow may be about 15-50%, preferably about 25%. The AHM precursor is a hydrocarbon. The precursor may be defined by a formula $C_XH_Y$, wherein X=2 to 10 and Y=2-24, and it may be ethylene.

Other process parameters may also be modulated. For example, the chamber pressure may be pulse modulated. In one instance, the chamber pressure is higher when the precursor flow is on, and lower when the precursor flow is off. Also, a carrier gas flow may be pulsed modulated. In one instance, the carrier gas flow is lower when the precursor flow is on, and higher when the precursor flow is off. The carrier gas may be argon, helium or nitrogen.

The present invention has among its advantages producing an AHM film with substantially no deposits on sidewalls of a via or trench. The AHM film has high etch selectivity relative to underlying layers and can be deposited at about 400° C. Because the sidewalls are clear, bottom-up fill of vias and trenches with AHM film can be achieved.

In another aspect, the present invention pertains to a partially fabricated semiconductor device. The device includes a dielectric layer having features and an amorphous carbon layer. The features are defined by a bottom and sidewalls. The amorphous carbon layer has a relatively uniform thickness on a field of the dielectric layer between features and a relative uniform thickness at the bottom of the features. In a feature, the amorphous carbon thickness at the sidewall and in the center of the feature does not differ substantially. For example, the thickness difference may be 10%, 5%, or less. The sidewalls above the amorphous carbon are substantially free of amorphous carbon deposits. In certain embodiments, the amorphous carbon is an ashable hardmask.

These and other aspects and advantages of the invention are described further below and with reference to the drawings.

BRIEF DESCRIPTION OF THE DRAWINGS

FIG. 8 is a table showing data illustrating the effect of varying the number of precursor pulses in a hard mask film deposition process in accordance with one aspect of the present invention.

DETAILED DESCRIPTION OF THE INVENTION

Figure 1:
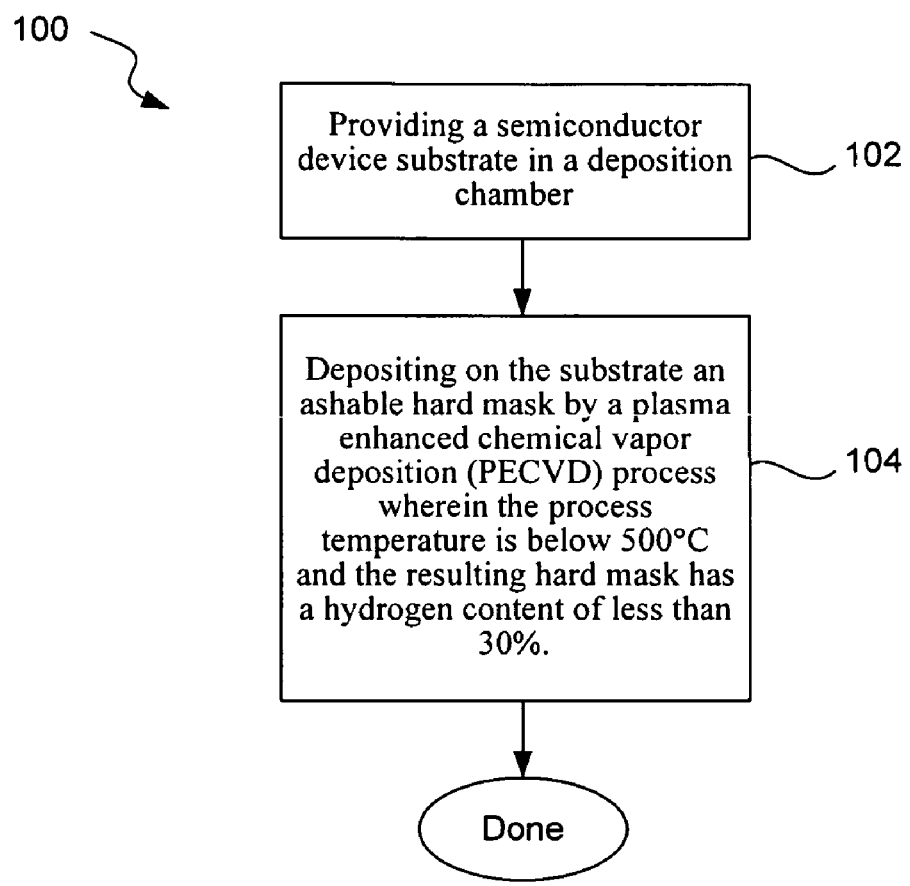
FIG. 1 depicts important stages in a general process flow for a method of forming an ashable hard mask in accordance with the present invention.

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Introduction

Hard masks are used as etch stop layers in semiconductor processing. Ashable hard masks (AHM) have a chemical composition that allows them to be removed by a technique referred to as ashing once they have served their purpose. An ashable hard mask is generally composed of amorphous carbon, or carbon & hydrogen with trace amount of one or more dopants (e.g., Nitrogen, Fluorine, Boron, Silicon). The bonding structure in these hard masks can vary from SP2 (graphite-like) to SP3 (diamond-like) or a combination of both, depending on the deposition conditions.

In a typical application, after etching, the hard mask has served its purpose and must be removed from the underlying dielectric oxide (e.g., $SiO_2$). This is generally accomplished, at least in part, by ashing, also referred to as "plasma ashing" or "dry stripping." Substrates with hard masks to be ashed, generally partially fabricated semiconductor wafers, are placed into a chamber under vacuum, and monatomic oxygen from a plasma reacts with the hard mask to oxidize it to water, carbon monoxide, and carbon dioxide. The plasma is formed either in the chamber or remotely by subjecting oxygen to radio frequency power. In some instances, complete removal of the hard mask may be accomplished by following the ashing with additional wet or dry etching processes, for example when the ashable hard mask leaves behind any residue that cannot be removed by ashing alone.

Etch selectivity of AHM film is influenced primarily by the incorporated concentration of hydrogen. Reducing the amount of hydrogen incorporated in the film drives down the etch rate of the hard mask, thus increasing the selectivity relative to an underlying oxide dielectric. The lower temperature process also allows reduction of the overall thermal budget for a wafer. Where a trench or a via needs to be filled with AHM, it is important to fill it completely to protect the often sensitive structures from etching. AHM deposition on the sidewalls impedes such bottom-up filling. Thus AHM deposition where the sidewalls are substantially free of AHM is desirable. This might be needed in double patterning applications where side wall needs to be preferentially etched while maintaining the height of a structure to further shrink the critical dimension. In such an application, first the zero sidewall coverage AHM can be deposited on the top and bottom of a line. Then a plasma etch is performed which etches the sidewall of the line while the top and bottom surface is protected by the AHM film. By doing this, the critical dimension of the line can be reduced to desired width. After the sidewall etch, AHM can be easily removed by stripping in an $O_2$ plasma.

In other embodiments, an amorphous carbon layer deposited in accordance with the methods disclosed herein may be used as a sacrificial layer to protect structures below. In still other embodiments, amorphous carbon may be used as self-aligner to allow deposition, oxidation, or other chemical reactions (nitridation, silicide formation, etc) only on the sidewalls of a feature. A liner, such as a diffusion barrier, nitride spacer, or a protective layer may be deposited on the sidewalls. The sidewalls may be oxidized or nitrided by plasma while the amorphous carbon shields the other surfaces. This layer could also be used in a gap fill application, where in such a layer is first deposited to fill up a portion of a trench or via, for example, on top of a source or drain region. The layer also deposits on top of the feature. Subsequently the film on the top of the feature is removed by CMP leaving behind a via or trench partially filled with void free amorphous carbon film. The deposition of this layer combined with CMP can be employed to make self aligned contacts. Thus, other uses for amorphous carbon outside of the context of AHM are envisioned in this disclosure. In describing deposition processes and structure, amorphous carbon and ashable hard mask are used interchangeably.

The present invention produces AHM with low hydrogen content (less than 30%, e.g., less than 25% or less than 20% or about 15%) for process temperatures below 500° C. (e.g., below 400° C., or 300-400° C.). Such lower process temperatures are compatible with existing semiconductor processing equipment, in particular PECVD reactors, such as Sequel™ or Vector™ reactor chambers available from Novellus Systems, Inc., San Jose, Calif. Thus, an ashable hard mask with the improved performance characteristic of increased selectivity, may be made without any hardware change.

Pulsed PECVD Deposition Process

The invention provides low temperature, low H hard mask films produced by use of a pulsed film hydrocarbon precursor, plasma treatment, and plasma etch. The pulsed delivery of the precursor and plasma treatment reduce the amount of hydrogen incorporated in the resulting film and therefore drives down the etch rate of the hard mask thus increasing the selectivity. The plasma etch removes amorphous carbon deposited on the sidewalls to allow bottom-up filling. Other deposition process parameters, including plasma power, carrier gas flow and chamber pressure, may also be pulsed or modulated. The pulse characteristics can be varied by varying the pulse repetition frequency (frequency of turning the pulse ON and OFF) and duty cycle (fraction of time during which the precursor pulse is ON). For example, for a pulse with a frequency of 0.1 Hz and duty cycle of 40%, one pulse period is 10 seconds with precursor pulse being ON for only 4 seconds. This additional pulsing can enhance the effect in certain applications. Generally, the hydrogen content of the resulting hard mask may be modulated by pulsing of the hard mask precursor delivery alone or in combination with one or more other deposition process parameters.

FIG. 1 depicts important stages in a general process flow for a method of forming an ashable hard mask in accordance with the present invention. The method (100) involves providing a semiconductor device substrate in a deposition chamber (102) and depositing on the substrate an ashable hard mask by a plasma enhanced chemical vapor deposition (PECVD) process wherein the process (substrate) temperature is below 500° C. and the resulting hard mask has a hydrogen content of less than 30% (104).

Figure 2:
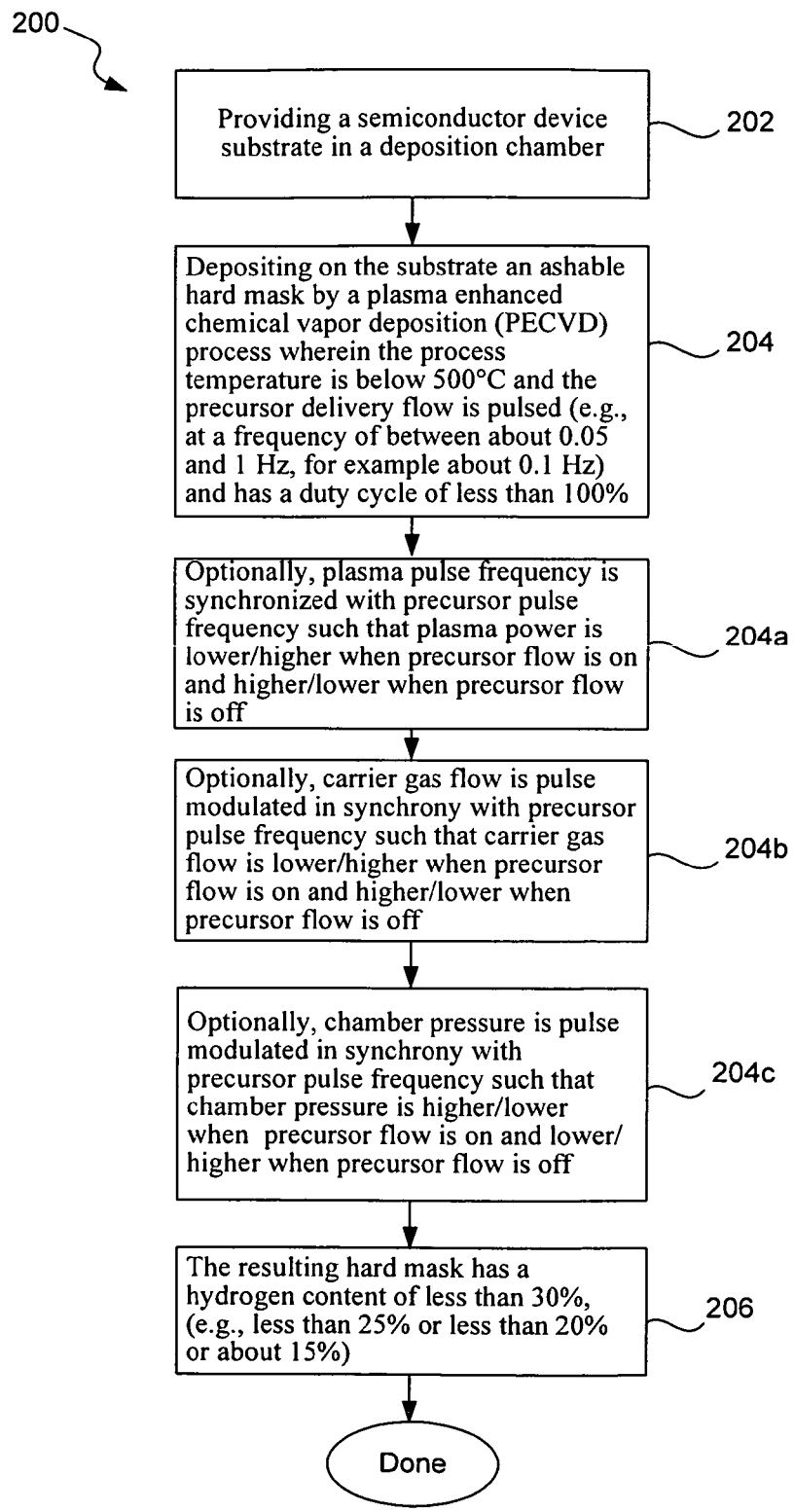
FIG. 2 depicts important stages in a general process flow for a method of forming an ashable hard mask in accordance with a specific embodiment of the present invention.

Deposition of an ashable hard mask by a plasma enhanced chemical vapor deposition (PECVD) process wherein the process temperature is below 500° C. and the resulting hard mask has a hydrogen content of less than 30% can be accomplished by a deposition process including a pulsed delivery flow of a hard mask precursor to the deposition chamber. FIG. 2 is a process flow for a method of forming an ashable hard mask according to a specific embodiment of this aspect of the invention. The method (200) again involves providing a semiconductor device substrate in a deposition chamber (202). The ashable hard mask is deposited on the substrate by a plasma enhanced chemical vapor deposition (PECVD) process wherein the process temperature of below 500° C. (e.g., no more than 400° C., or 300-400° C. or about 400° C.) wherein the precursor delivery flow is pulsed, i.e., has a duty cycle of less than 100% (e.g., 10 to 50%, 20 to 40%, such as 25 or 40%) (204). The pulsed precursor delivery flow can have a frequency of between about 0.05 and 1 Hz, or about 0.09 and 0.2 Hz, or about 0.1 and 0.15 Hz, for example about 0.1 Hz.

The precursor is a generally a hydrocarbon, for example, one defined by the formula $C_XH_Y$, wherein X=2 to 10 and Y=2-24. Specific examples include methane, acetylene, ethylene, propylene, butane, cyclohexane, benzene and toluene and ($CH_4$, $C_2H_2$, $C_2H_4$, $C_3H_6$, $C_4H_{10}$, $C_6H_6$, $C_6H_{12}$ and $C_7H_8$, respectively). Ethylene is a preferred precursor in many applications.

Figure 3:
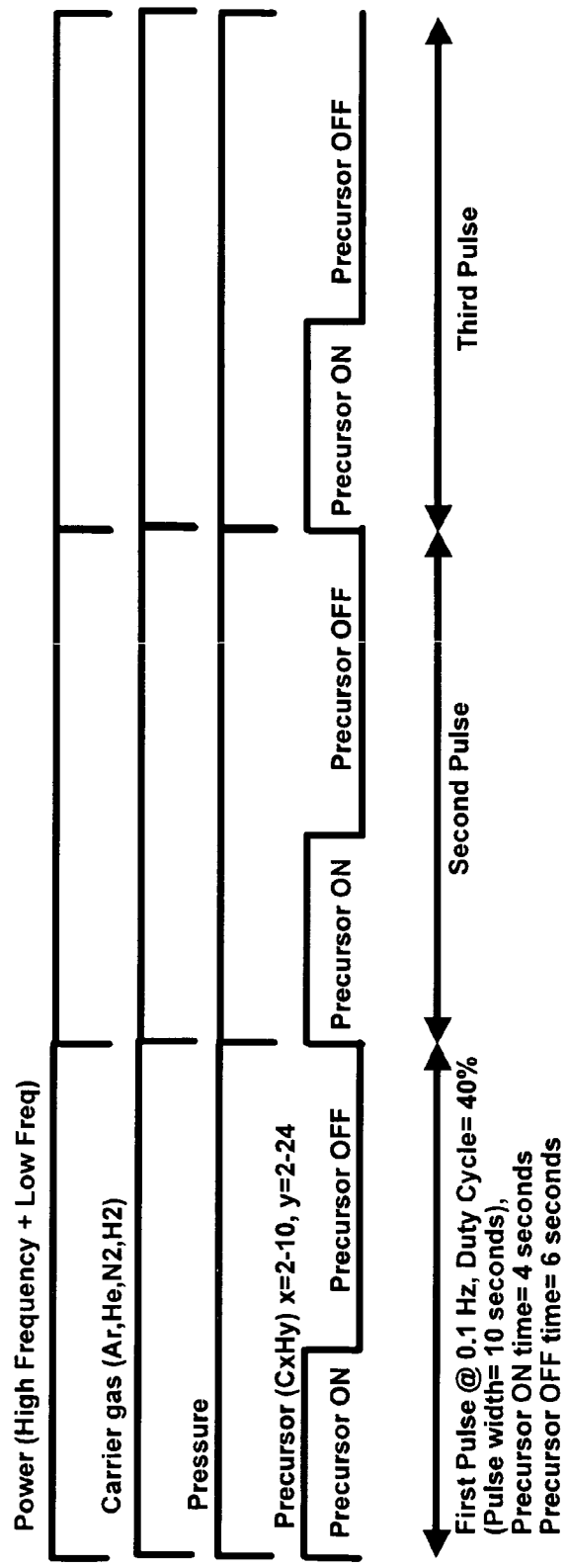
FIG. 3 depicts a timing sequence diagram for one specific embodiment of the invention.

FIG. 3 depicts a timing sequence diagram for one specific embodiment of the invention in which an ashable hard mask is formed by a plasma enhanced chemical vapor deposition (PECVD) process having the following parameters: a process temperature of about 400° C. and a 0.1 Hz pulsed delivery flow of a hard mask precursor to the deposition chamber with a duty cycle of 40%. The remaining process parameters are held static. This results in a pulse width of 10 seconds with a precursor flow on time of 4 seconds/off time of 6 seconds. Three pulse are shown in the figure. In other embodiments, the pulse frequency can be varied, for example from 0.05 to 1 Hz. During each pulse, between about 10 to 100 Å of film is grown; therefore, to grow a 2000 Å film, as would be common for a typical hard mask, 20-200 precursor pulses would be required.

The plasma contains an etching species to etch the film deposited when the precursor flow is off. The etching species is oxygen or hydrogen. The etching species is created by providing a hydrogen or oxygen containing gas to the plasma. The hydrogen or oxygen containing gas may be $H_2$, $NH_3$, $CF_R$, $O_2$, or $CO_2$. Of these, hydrogen, ammonia, and a combination of these two are preferred as they are compatible with the amorphous carbon precursors. Oxygen and carbon dioxide can be used if they are injected while the precursor flow is off.

Referring again to FIG. 2, in addition, other deposition process parameters, including plasma power, carrier gas flow and chamber pressure, may also optionally be pulsed or modulated. For example, the plasma pulse frequency can be synchronized in time with the precursor pulse frequency such that the plasma power is lower when the precursor flow is on and higher when the precursor flow is off. In certain embodiments, the plasma pulse can also partially overlap the precursor flow pulse, so that the plasma power may be on while the precursor also flows. Note that the process requires a duration of plasma "on" without precursor flow to etch the as-deposited film, but whether the plasma is on during precursor flow is less important. To conserve total process time, it is preferred that the duration between precursor pulses to be dedicated to this etch.

In addition, or in the alternative, the carrier gas flow is pulse modulated in synchrony with the precursor pulse frequency such that the carrier gas flow is lower when the precursor flow is on and higher when the precursor flow is off; or vice versa such that the carrier gas flow is higher when the precursor flow is on and lower when the precursor flow is off (204b). And in addition, or in the alternative, the chamber pressure is pulse modulated in synchrony with the precursor pulse frequency such that the chamber pressure is higher when the precursor flow is on and lower when the precursor flow is off; or vice versa such that the chamber pressure is lower when the precursor flow is on and higher when the precursor flow is off (204c).

Figure 4:
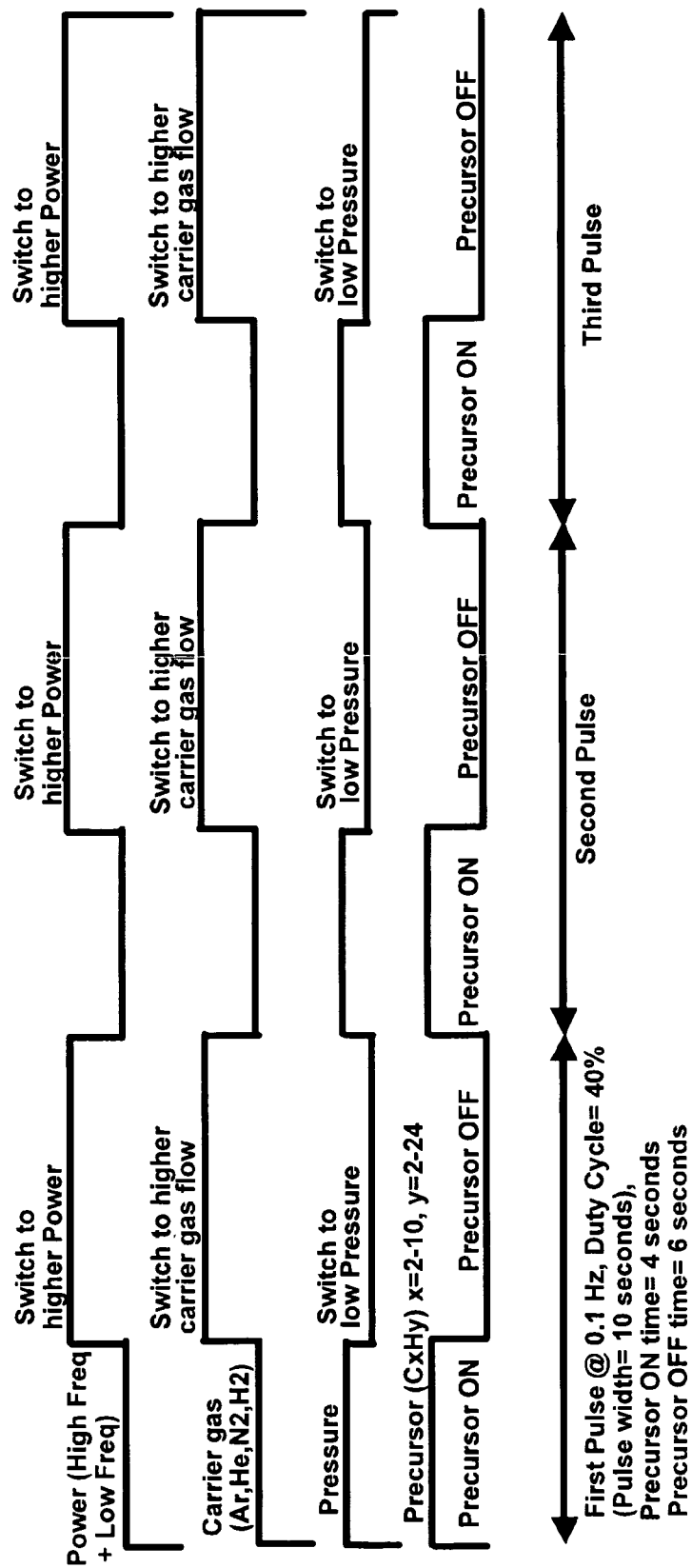
FIG. 4 depicts a timing sequence diagram for another specific embodiment of the invention.

FIG. 4 depicts a timing sequence diagram for another specific embodiment of the invention in which an ashable hard mask is formed by a plasma enhanced chemical vapor deposition (PECVD) process having the same process parameters as described above with reference to FIG. 3, and, in addition, an instance of each of the optional modulated process parameters described with reference to FIG. 2, 204a, 204b and 204c. That is, the plasma pulse is opposite of the precursor pulse. In other words, the plasma pulse is synchronized with the precursor pulse frequency such that the power is lower when the precursor flow is on and higher when the precursor flow is off. The carrier gas flow is pulse modulated in synchrony with the precursor pulse frequency such that the carrier gas flow is lower when the precursor flow is on and higher when the precursor flow is off. The chamber pressure is pulse modulated in synchrony with the precursor pulse frequency such that the chamber pressure is higher when the precursor flow is on and lower when the precursor flow is off.

Once more referring to FIG. 2, the resulting hard mask has a hydrogen content of less than 30%, e.g., less than 25% or less than 20% or about 15%) (206).

An aspect of the invention may also be expressed as a method of forming an ashable hard mask, the method involving providing a semiconductor device substrate in a deposition chamber, and depositing on the substrate an ashable hard mask by a plasma enhanced chemical vapor deposition (PECVD) process having a process temperature of less than 500° C., a plasma containing an etching species, and a pulsed delivery flow of a hard mask precursor to the deposition chamber (for example, at a frequency of between about 0.05 and 1 Hz) with a duty cycle of less than 100%. The resulting hard mask has a hydrogen content of less than 30%. In a specific embodiment, the process has a process temperature of no more than about 400° C., a pulsed delivery flow of a hard mask precursor to the deposition chamber having a frequency of between 0.05 and 1 Hz with a duty cycle of less than 50%, and the resulting hard mask has a hydrogen content of less than 20%.

In yet another aspect, the invention may also be expressed as a method of modulating hydrogen content in a deposited ashable hard mask. The method involves determining a base ashable hard mask hydrogen concentration resulting from deposition using plasma enhanced chemical vapor deposition (PECVD) process parameters comprising a static hard mask precursor delivery flow to the deposition chamber; providing a semiconductor device substrate in a deposition chamber; and depositing on the substrate an ashable hard mask by the plasma enhanced chemical vapor deposition (PECVD) process altered such that the precursor delivery flow is pulsed, for example, at a frequency of between about 0.05 and 1 Hz. The amorphous carbon film is etched by the plasma when the precursor flow is off. The hydrogen content in the resulting deposited ashable hard mask is less than the base ashable hard mask hydrogen concentration. In a specific embodiment, the process has a process temperature of less than 500° C., e.g., no more than about 400° C., a pulsed delivery flow of a hard mask precursor to the deposition chamber having a frequency of between about 0.05 and 1 Hz with a duty cycle of less than 100%, e.g., less than 50%, and the resulting hard mask has a hydrogen content of less than 30%, e.g., less than 20%.

The other parameters for modulating process conditions described above also apply to these alternatively expressed aspects of the invention. In all aspects, the hydrogen content can be modulated by varying the number of pulses and the pulse frequency and duty cycle.

While the invention is not limited by any particular theory, it is believed that the H content in the hard mask film is reduced by breaking —CHx bonds in the film and subsequent formation of —C═C— by plasma treatment of few monolayers of as-deposited film, as is achieved by hard mask precursor pulsing in accordance with the present invention. The etching species in the plasma preferentially removes amorphous carbon film deposited on the sidewalls of vias and trenches. Having deposit-free sidewalls enables bottom-up fill in the vias and trenches.

Apparatus

The present invention is preferably implemented in a plasma enhanced chemical vapor deposition (PECVD) reactor. Such a reactor may take many different forms. Generally, the apparatus will include one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). In one embodiment, a wafer undergoing hard mask deposition is transferred from one station to another within a reactor chamber during the process. For example, for a 2000 Å hard mask film deposition, 500 Å of film may be deposited at each of four stations in accordance with the present invention. Of course, the full film deposition may occur entirely at a single station or any fraction of the total film thickness may be deposited at any number of stations.

While in process, each wafer is held in place by a pedestal, wafer chuck and/or other wafer holding apparatus. For certain operations in which the wafer is to be heated, the apparatus may include a heater such as a heating plate. In a preferred embodiment of the invention, a Vector™ (e.g., C23 Vector) or Sequel™ (e.g., C2 Sequel) reactor, produced by Novellus Systems of San Jose, Calif., may be used to implement the invention.

Figure 5:
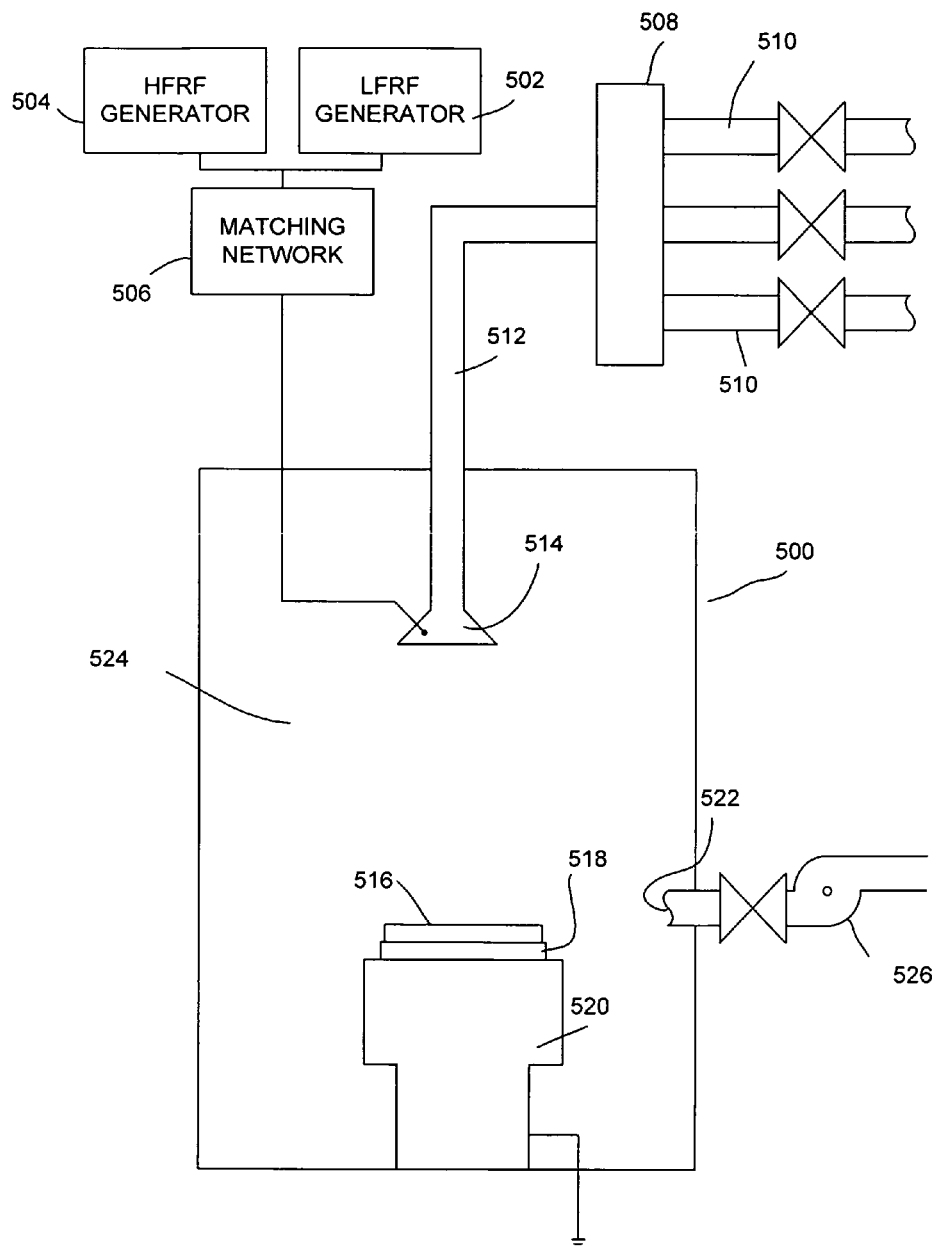
FIG. 5 is a simple block diagram depicting a PECVD reactor arranged for implementing the present invention.

FIG. 5 provides a simple block diagram depicting various reactor components arranged for implementing the present invention. As shown, a reactor 500 includes a process chamber 524, which encloses other components of the reactor and serves to contain the plasma generated by a capacitor type system including a showerhead 514 working in conjunction with a grounded heater block 520. A high-frequency RF generator 502, connected to a matching network 506, and a low-frequency RF generator 504 are connected to showerhead 514. The power and frequency supplied by matching network 506 is sufficient to generate a plasma from the process gas, for example 400-700 W total energy. In one implementation of the present invention both the HFRF generator and the LFRF generator are used. In a typical process, the high frequency RF component is generally between 2-60 MHz; in a preferred embodiment, the HF component is 13.56 MHz. The low frequency LF component is generally between 250-400 kHz; in a preferred embodiment, the LF component is 350 kHz.

Within the reactor, a wafer pedestal 518 supports a substrate 516. The pedestal typically includes a chuck, a fork, or lift pins to hold and transfer the substrate during and between the deposition and/or plasma treatment reactions. The chuck may be an electrostatic chuck, a mechanical chuck or various other types of chuck as are available for use in the industry and/or research.

The process gases are introduced via inlet 512. Multiple source gas lines 510 are connected to manifold 508. The gases may be premixed or not. Appropriate valving and mass flow control mechanisms are employed to ensure that the correct gases are delivered during the deposition and plasma treatment phases of the process. In case the chemical precursor(s) is delivered in the liquid form, liquid flow control mechanisms are employed. The liquid is then vaporized and mixed with other process gases during its transportation in a manifold heated above its vaporization point before reaching the deposition chamber.

Process gases exit chamber 500 via an outlet 522. A vacuum pump 526 (e.g., a one or two stage mechanical dry pump and/or a turbomolecular pump) typically draws process gases out and maintains a suitably low pressure within the reactor by a close loop controlled flow restriction device, such as a throttle valve or a pendulum valve.

The invention may be implemented on a multi-station or single station tool. In specific embodiments, the 300 mm Novellus Vector™ tool having a 4-station deposition scheme or the 200 mm Sequel™ tool having a 6-station deposition scheme are used. It is possible to index the wafers after every deposition and/or post-deposition plasma anneal treatment until all the required depositions and treatments are completed, or multiple depositions and treatments can be conducted at a single station before indexing the wafer. It has been shown that film stress is the same in either case. However, conducting multiple depositions/treatments on one station is substantially faster than indexing following each deposition and/or treatment.

Examples

The following examples are provided to further illustrate aspects and advantages of the present invention. These examples are provided to exemplify and more clearly illustrate aspects of the present invention and are in no way intended to be limiting.

Figure 6:
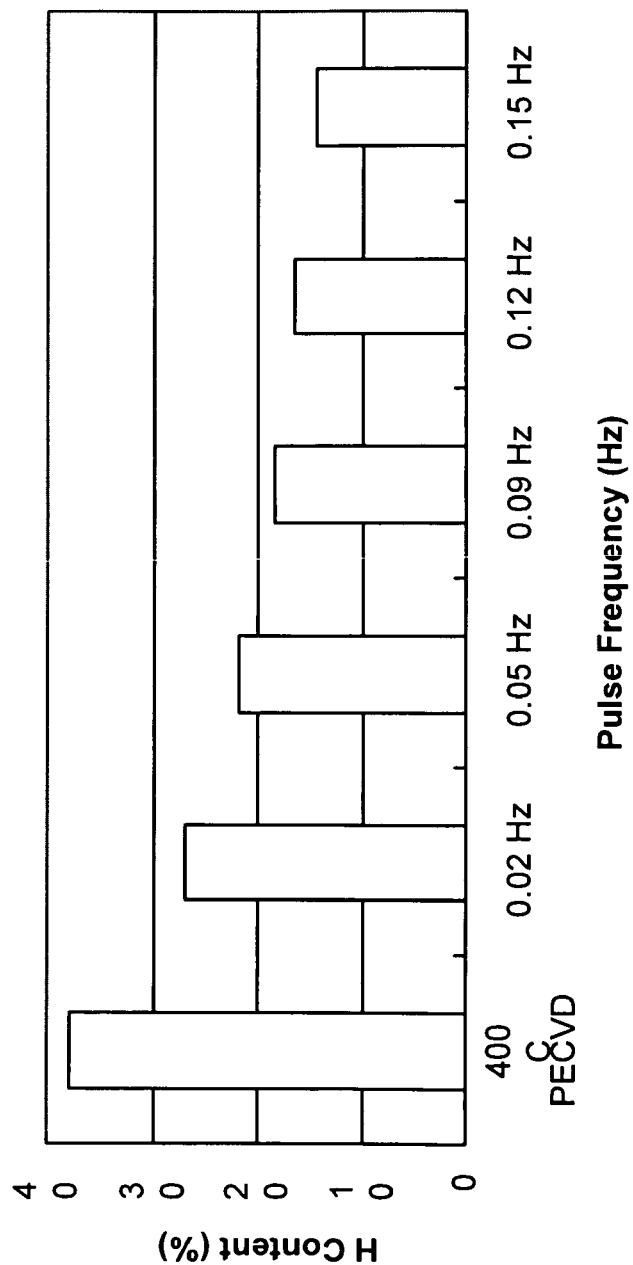
FIG. 6 depicts a histogram plot showing the effect of varying the precursor pulse frequency in accordance with one aspect of the present invention.

Referring to FIG. 6, the effect of varying the precursor pulse frequency is illustrated. Hydrogen content in the resulting hard mask film can be varied from about 40% for a 400° C. PECVD process having a static precursor flow (duty cycle of 100%) to about 15% H for a hard mask film deposited using a 400° C. PECVD process having a pulsed precursor flow in accordance with the present invention. Increasing the pulse frequency from 0.02 to 0.15 Hz decreased hydrogen content from about 28% to about 15%. Duty cycle was maintained at 25% for this study, and plasma power, carrier gas flow and chamber pressure were kept static. The following table lists the parameters for the process used in the experiment for this example (with pulse frequency of 0.15 Hz and duty cycle of 25%).

|  | | Parameter Range |
|---|---|---|
| Precursor ON Phase | | |
| $N_2$ (sccm) | 1000 | 0 to 10000 |
| $C_2H_2$ (sccm) | 900 | 0 to 10000 |
| He (sccm) | 9000 | 1000 to 20000 |
| HF Power (W) | 600 | 0 to 5000 |
| LF Power (W) | 600 | 0 to 5000 |
| Pressure (Torr) | 5 | 1 to 20 |
| Precursor ON time (sec) | 1.7 | 0 to 60 |
| Precursor OFF Phase | | |
| $N_2$ | 1000 | 0 to 10000 |
| $C_2H_2$ | 0 | 0 |
| He | 9000 | 1000 to 20000 |
| HF Power | 600 | 0 to 5000 |
| LF Power | 1200 | 0 to 5000 |
| Pressure | 4 | 1 to 20 |
| Precursor OFF time (sec) | 5 | 0 to 60 |

Figure 7:
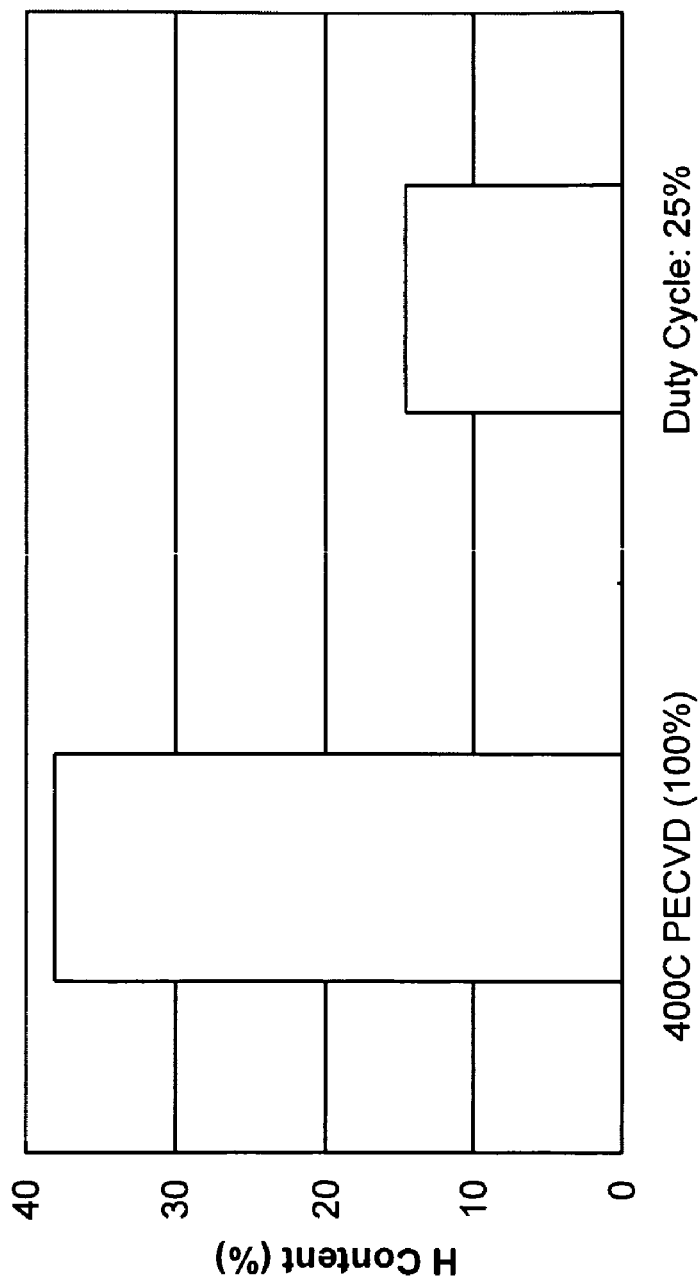
FIG. 7 depicts a histogram plot showing the effect of varying the precursor pulse duty cycle in accordance with one aspect of the present invention.

Referring to FIG. 7, the effect of varying the precursor pulse duty cycle is illustrated. Hydrogen content in the resulting hard mask film can be varied from about 40% for a 400° C. PECVD process having a static precursor flow and 100 duty cycle to about 15% for a hard mask film deposited using a 400° C. PECVD process having a pulsed precursor flow with a frequency of 0.15 Hz and a 25% duty cycle in accordance with the present invention. Plasma power, carrier gas flow and chamber pressure were kept static for this study.

Referring to FIG. 8, the effect of varying the number of precursor pulses is illustrated. For a particular pulse frequency and duty cycle, H content remains the same. Therefore, as shown in the table, films with different thicknesses but with similar H content may be manufactured by changing (increasing) the number of pulses.

In another example, the effect of plasma etching during the precursor off portion of the precursor pulse on the sidewalls of a trench and for three vias and total deposits on in the bottom and on top is investigated. The following table lists the parameters for the process used in the experiment for this example (with pulse frequency of 0.11 Hz and duty cycle of 29%) for a total of 48 pulses.

|  | | Parameter Range |
|---|---|---|
| Precursor ON Phase | | |
| $N_2$ (sccm) | 1000 | 0 to 10000 |
| $C_2H_2$ (sccm) | 900 | 0 to 10000 |
| He (sccm) | 9000 | 1000 to 20000 |
| HF Power (W) | 600 | 0 to 5000 |
| LF Power (W) | 1200 | 0 to 5000 |
| Pressure (Torr) | 5.2 | 1 to 20 |
| Precursor ON time (sec) | 2.6 | 0 to 60 |
| Precursor OFF Phase | | |
| $N_2$ | 0 | 0 to 10000 |
| $C_2H_2$ | 0 | 0 |
| $NH_3$ | 1000 | 500 to 3000 |
| He | 9000 | 1000 to 20000 |
| HF Power | 600 | 0 to 5000 |
| LF Power | 1200 | 0 to 5000 |
| Pressure | 4 | 1 to 20 |
| Precursor OFF time (sec) | 6.4 | 0 to 60 |

Figure 9B:
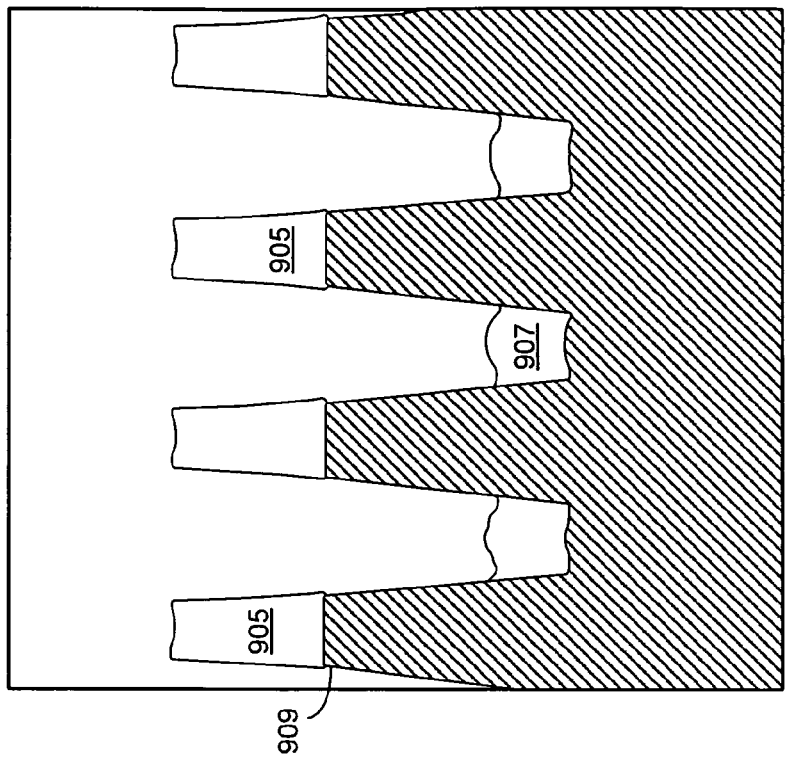
FIGS. 9A and 9B are drawings depicting SEM images taken of AHM film deposited in accordance with one aspect of the present invention.
Figure 9A:
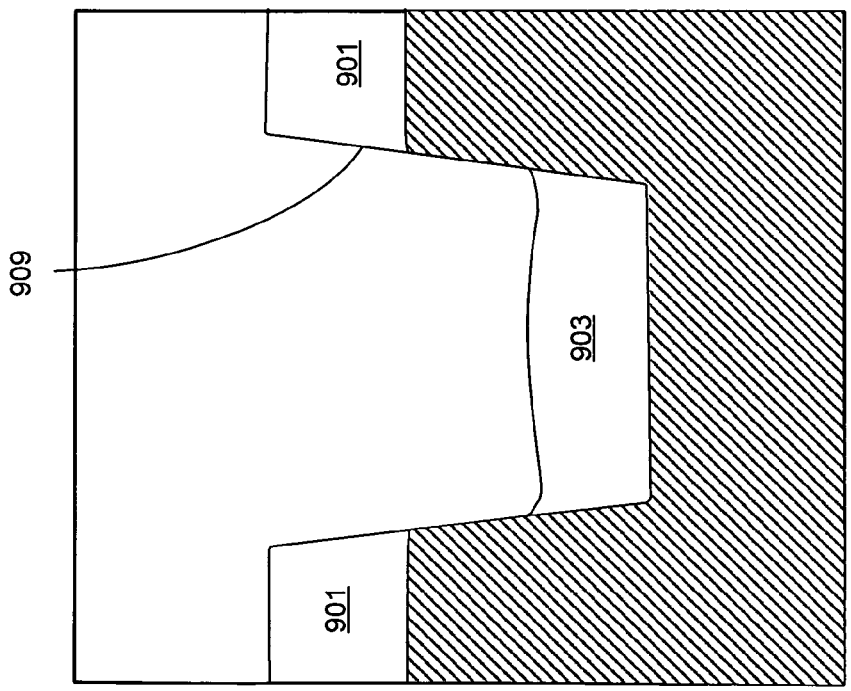

During the precursor off phase, ammonia gas was flowed to the plasma to provide the etching species. FIGS. 9A and 9B are drawings of the SEM photograph taken for the amorphous carbon film. After 48 pulses, 595 nm of amorphous carbon (901) was deposited on top of structures next to a trench, also know as top hats, and 520 nm was deposited in the bottom of the trench (903). For vias with an aspect ratio of approximately 3 to 1,648 nm of amorphous carbon (905) was deposited on top of the structures and 313 nm at the bottom (907). The thickness deposited shows that, for a trench (lower aspect ratio), about the same amount of amorphous carbon is deposited on top in the field and in the bottom of the trench. For a via, less amorphous carbon is deposited in the via bottom. The sidewalls for both the trench and vias are free of AHM deposits, thus allowing bottom-up filling even if the top hats get taller. Significantly, no overhang developed off the tophats into the trench or via, allowing more amorphous carbon material to deposit unimpeded. Note that the amorphous carbon film thickness within a trench bottom or on top a field is substantially uniform. In FIGS. 9A and 9B, the thickness uniformity within the feature is 90% or better. The thickness uniformity on top of a field is 95% or better.

CONCLUSION

Although the foregoing invention has been described in some detail for purposes of clarity of understanding, it will be apparent that certain changes and modifications may be practiced within the scope of the appended claims. It should be noted that there are many alternative ways of implementing both the process and compositions of the present invention. Accordingly, the present embodiments are to be considered as illustrative and not restrictive, and the invention is not to be limited to the details given herein.

All references cited herein are incorporated by reference for all purposes.

What is claimed is:

1. A method of forming an ashable hard mask in a trench or a via, comprising:
   providing a semiconductor device substrate having a trench or a via in a deposition chamber;
   depositing in the trench or the via on the substrate an ashable hard mask by a plasma enhanced chemical vapor deposition (PECVD) process comprising,
   a pulsed delivery flow of hard mask precursor to the deposition chamber with a duty cycle of less than 100%,
   a plasma containing an etching species in the deposition chamber,
   wherein the process temperature is below 500° C. and the resulting hard mask has a hydrogen content of less than 30%, and,
   wherein a wall of the trench or a via is substantially free of ashable hard mask deposit.

2. The method of claim 1, wherein the etching species is hydrogen.

3. The method of claim 2, wherein the etching species is provided by flowing $H_2$ or $NH_3$ into the plasma.

4. The method of claim 1, wherein the etching species during no precursor flow is oxygen.

5. The method of claim 4, wherein the etching species is providing by flowing $O_2$ or $CO_2$ into the plasma.

6. The method of claim 1, wherein the plasma power is pulse modulated.

7. The method of claim 6, wherein the plasma power is pulse modulated higher when the precursor flow is off.

8. The method of claim 6, wherein the precursor flow and plasma power pulses do not overlap.

9. The method of claim 6, wherein a portion of the plasma high pulse overlaps a portion but not all of the precursor flow pulse.

10. The method of claim 1, wherein the plasma during no precursor flow removes ashable hard mask material from the sidewalls.

11. The method of claim 1, wherein the process temperature is between about 300 and 400° C.

12. The method of claim 1, wherein the resulting hard mask has a hydrogen content of less than 15%.

13. The method of claim 1, wherein the pulsed precursor delivery flow has a frequency of between about 0.09 and 0.2 Hz.

14. The method of claim 1, wherein a duty cycle of the pulsed precursor delivery flow is about 25%.

15. The method of claim 1, wherein the deposition process further comprises a pulse modulated carrier gas flow such that the carrier gas flow is lower when the precursor flow is on and higher when the precursor flow is off.

16. The method of claim 15, wherein the carrier gas is Ar, He, or $N_2$.

17. The method of claim 1, wherein a chamber pressure of the deposition process is pulse modulated such that the chamber pressure is higher when the precursor flow is on and lower when the precursor flow is off.

18. The method of claim 1, wherein the precursor is a hydrocarbon.

19. The method of claim 18, wherein the precursor is a hydrocarbon defined by a formula $C_XH_Y$, wherein X=2 to 10 and Y=2-24.

20. The method of claim 19, wherein the precursor is ethylene.

21. A method of forming an amorphous carbon layer in a trench or a via, comprising:
  providing a semiconductor device substrate having a trench or a via in a deposition chamber;
  depositing in the trench or the via on the substrate an amorphous carbon layer by a plasma enhanced chemical vapor deposition (PECVD) process comprising,
    a pulsed delivery flow of amorphous carbon precursor to the deposition chamber with a duty cycle of less than 100%,
    a plasma containing an etching species in the deposition chamber,
    wherein the process temperature is below 500° C. and the resulting amorphous carbon has a hydrogen content of less than 30% and,
    wherein a wall of the trench or a via is substantially free of amorphous carbon deposit.

22. The method of claim 1, wherein other process parameters are held static.

* * * * *